(12) United States Patent
Jun

(10) Patent No.: US 7,795,069 B2
(45) Date of Patent: Sep. 14, 2010

(54) IMAGE SENSOR AND METHOD FOR MANUFACTURING THE SAME

(75) Inventor: Sung-Ho Jun, Songpa-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 24 days.

(21) Appl. No.: 12/344,492

(22) Filed: Dec. 27, 2008

(65) Prior Publication Data
US 2009/0206337 A1   Aug. 20, 2009

(30) Foreign Application Priority Data
Dec. 27, 2007   (KR) ............... 10-2007-0139463

(51) Int. Cl.
*H01L 21/00*   (2006.01)

(52) U.S. Cl. .............. 438/96; 438/458; 257/E25.032; 257/E27.133; 257/E31.058

(58) Field of Classification Search ............. 438/67, 438/96, 98, 455, 458; 257/E25.032, E27.133, 257/E31.058
See application file for complete search history.

(56) References Cited

U.S. PATENT DOCUMENTS

2008/0230864 A1 *   9/2008   Lee .......................... 257/448

* cited by examiner

*Primary Examiner*—Quoc D Hoang
(74) *Attorney, Agent, or Firm*—Sherr & Vaughn, PLLC

(57) ABSTRACT

An image sensor includes a lower metal interconnection, an interlayer dielectric, a first substrate, a photodiode, an upper electrode and an amorphous silicon layer. The lower metal interconnection and the interlayer dielectric are formed over the first substrate including a pixel region and a peripheral region. The photodiode is formed over the pixel region of the first substrate. The upper electrode layer is connected to the photodiode. The amorphous silicon layer is formed between the photodiode and the interlayer dielectric.

11 Claims, 7 Drawing Sheets

IMAGE SENSOR AND METHOD FOR MANUFACTURING THE SAME

The present application claims priority under 35 U.S.C. §119 to Korean Patent Application No. 10-2007-0139463 (filed Dec. 27, 2007), which is hereby incorporated by reference in its entirety.

BACKGROUND

A related complementary metal oxide silicon (CMOS) image sensor includes a photodiode region for converting an optical signal to an electrical signal, and a transistor region for processing the converted electrical signal, in which the photodiode region and the transistor region are horizontally arranged. In a horizontal type CMOS image sensor, a photodiode and a transistor are horizontally formed adjacent to each other over a substrate. Therefore, an additional region for forming the photodiode is utilized, which may decrease the fill factor and limit the possibility of resolution.

SUMMARY

Embodiments relate to an image sensor that may include at least one of the following: a lower metal interconnection and an interlayer dielectric over a first substrate including a pixel region and a peripheral region; a photodiode over the pixel region of the first substrate; an upper electrode layer connected to the photodiode; and an amorphous silicon layer between the photodiode and the interlayer dielectric.

Embodiments relate to a method for manufacturing an image sensor that may include one or more of the following: forming an interlayer dielectric over a first substrate including a pixel region and a peripheral region; forming an amorphous silicon layer over the interlayer dielectric including the lower metal interconnection; forming a second substrate including a photodiode; bonding the second substrate including the photodiode on the amorphous silicon layer such that the amorphous silicon layer contacts the photodiode; removing the second substrate such that the photodiode is left on the amorphous silicon layer; forming an upper electrode layer, which is connected to the photodiode and the lower metal interconnection of the peripheral region; and forming a passivation layer over the upper electrode layer.

DRAWINGS

Example FIGS. 1 through 13 illustrate an image sensor and a method for manufacturing an image sensor in accordance with embodiments.

DESCRIPTION

An image sensor and a method for manufacturing an image sensor in accordance with embodiments will be described in detail with reference to the accompanying drawings. Example FIG. 13 is a sectional view of an image sensor in accordance with embodiments.

Figure 13:
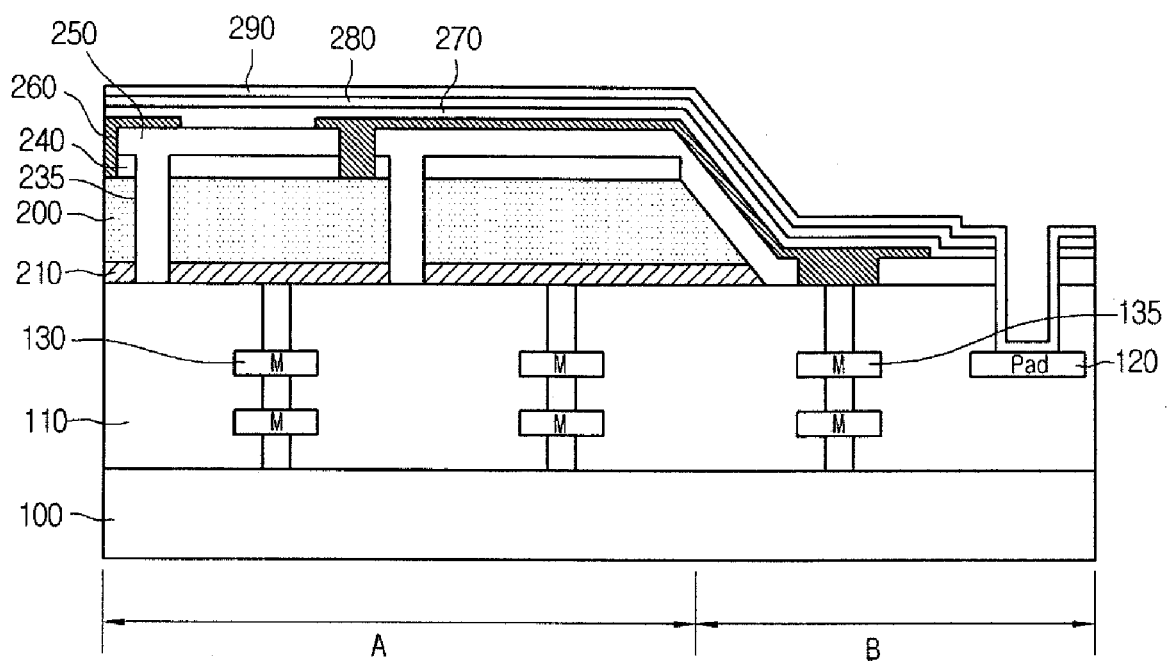

As illustrated in example FIG. 13, an image sensor in accordance with embodiments may include: lower interconnections 130 and 135, interlayer dielectric 110 and amorphous silicon layer 210 on and/or over first substrate 100 including a pixel region (A) and a peripheral region (B); photodiode 200 over the pixel region (A) of first substrate 100; device isolation layer 250 disposed over photodiode 200 such that the photodiode 200 may separated for each unit pixel; and upper electrode layer 260 disposed on and/or over device isolation layer 250 and connected to photodiode 200.

Photodiode 200 may be formed by doping a single crystalline or polycrystalline silicon layer with a p-type or n-type impurity. Amorphous silicon layer 210 may be disposed on and/or over interlayer dielectric 110. Device isolation layer 250 may be formed in device isolation trench 235 formed in photodiode 200, and on and/or over photodiode 200.

Upper electrode layer 260 may be may be electrically connected to photodiode 200 of the pixel region (A) and lower metal interconnection 135 of the peripheral region (B). First passivation layer 270 and second passivation layer 280 may be disposed on and/or over first substrate 100 including upper electrode layer 260.

The image sensor in accordance with embodiments can achieve a vertical integration because photodiode 200 may be formed on and/or over first substrate 100 including lower metal interconnections 130 and 135. The image sensor in accordance with embodiments can minimize the generation defects in the photodiode because photodiode 200 may be formed inside the crystalline semiconductor layer. The image sensor in accordance with embodiments can separate photodiode 200 for each unit pixel because device isolation layer 250 may be formed in photodiode 200.

A method for manufacturing an image sensor in accordance with embodiments will now be described with reference to example FIGS. 1 through 13. As illustrated in example FIG. 1, lower metal interconnections 130 and 135, interlayer dielectric 110 and amorphous silicon layer 210 may be formed on, or over, first substrate 100. First substrate 100 may be a single crystalline or polycrystalline silicon substrate doped with a p-type impurity or n-type impurity.

A device isolation layer for defining an active region and a field region may be formed in first substrate 100. Also, circuitry of the pixel region (A) and circuitry of the peripheral region (B) may be formed on, or over, the active region. A transistor structure, which may be connected to a photodiode to convert received photo charges to an electrical signal, may include a transfer transistor, a reset transistor, a drive transistor and a select transistor and may be formed for each unit pixel.

Interlayer dielectric 110 including lower metal interconnections 130 and 135 for connecting a power line or signal line to the circuitry may be formed on and/or over the pixel region (A) and the peripheral region (B) of first substrate 100. Interlayer dielectric 110 may be formed in a multi-layer structure. Lower metal interconnection 130 may include a metal interconnection (M) and a plug. Lower metal interconnection 130 of the pixel region (A) may be formed for each unit pixel to deliver photo charges of the photodiode to the circuitry.

Lower metal interconnections 130 and 135 may be formed of various conductors including, for example, metal, alloy or silicide. For example, lower metal interconnections 130 and 135 may be formed of Al, Cu, Co or W. In embodiments, the plugs of lower metal interconnections 130 and 135 may be exposed to a surface of interlayer dielectric 110. During the forming of the metal interconnection (M) of lower metal interconnection 130, pad 120 may be formed on the peripheral region (B).

Amorphous silicon layer 210 may be formed in a thickness range of about 200 to about 1000 Å by various processes such as, for example, by a Plasma Enhanced Chemical Vapor Deposition (PECVD) or a Physical Vapor Deposition (PVD). A process for forming amorphous silicon layer 210 may be performed by supplying silane gas ($SiH_4$) and thermally annealing the silane gas ($SiH_4$) in a temperature range of about 150 to about 300° C. Because amorphous silicon layer 210 may be formed on and/or over interlayer dielectric 110, a bonding force between interlayer dielectric 110 and the photodiode can be enhanced in bonding the photodiode on interlayer dielectric 110.

Figure 1:
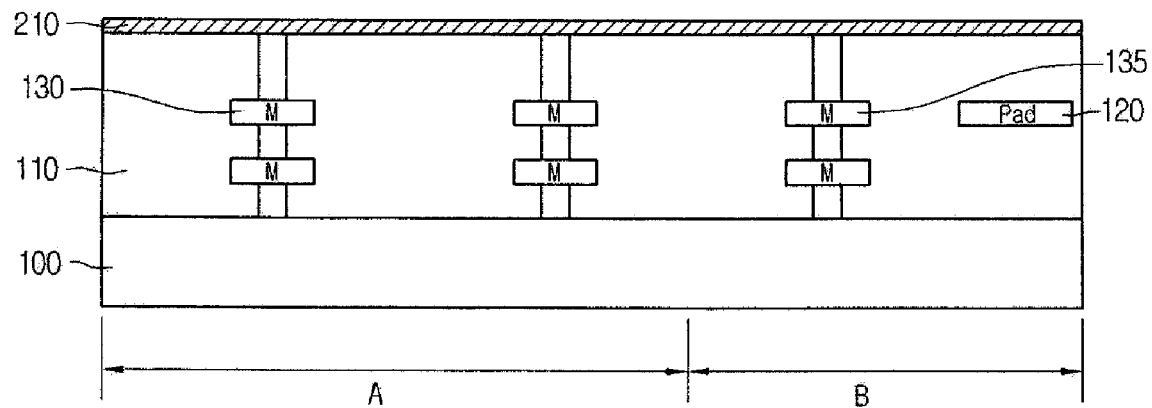
Figure 2:
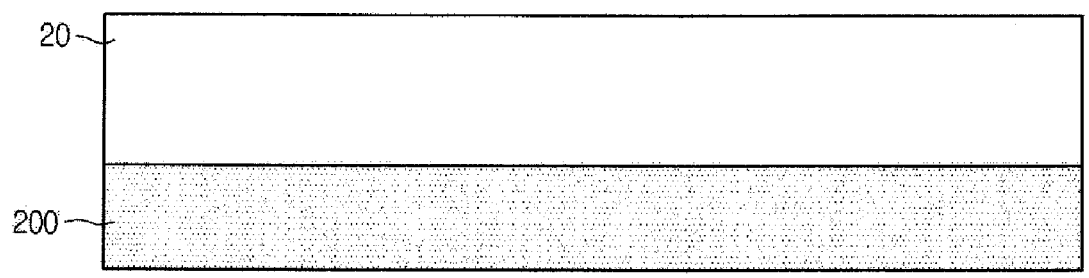

As illustrated in example FIG. 2, photodiode 200 may be formed on second substrate 20. Second substrate 20 may be a single crystalline or polycrystalline silicon substrate doped with a p-type impurity or n-type impurity. In embodiments, second substrate 20 may be a p-type substrate. First substrate 100 and second substrate 20 may have substantially the same size. Also, second substrate 20 may include an epitaxial layer.

Photodiode 200 may be formed inside second substrate 20. Photodiode 200 may include an n-type impurity region and a p-type impurity region. The n-type impurity region and p-type impurity region may be formed to contact each other so that photodiode 200 having a PN junction is formed. A hydrogen ion layer may be formed between second substrate 20 and photodiode 200. The hydrogen ion layer may operate to separate second substrate 20 from photodiode 200, and may be formed by implanting hydrogen ions.

Figure 3:
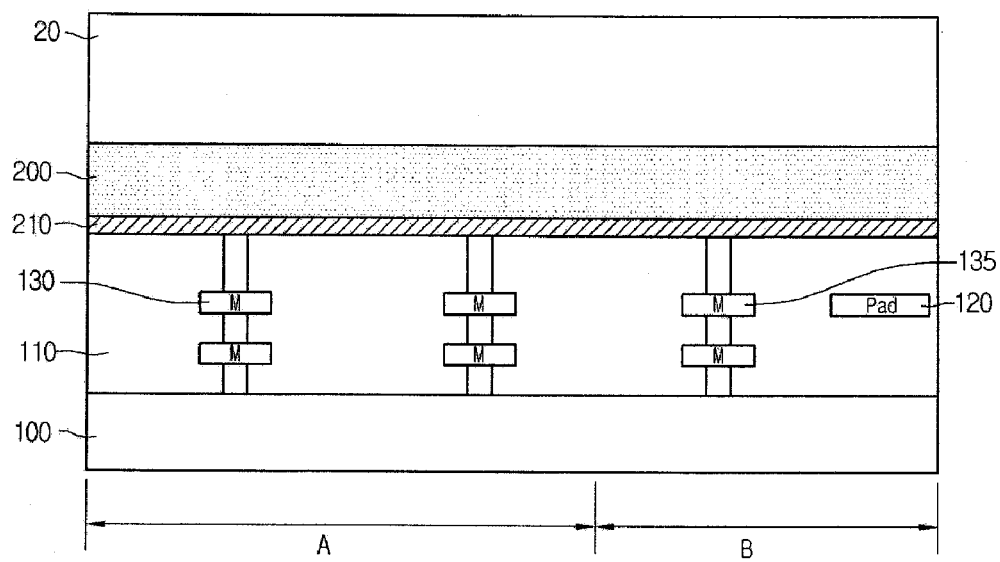
Figure 4:
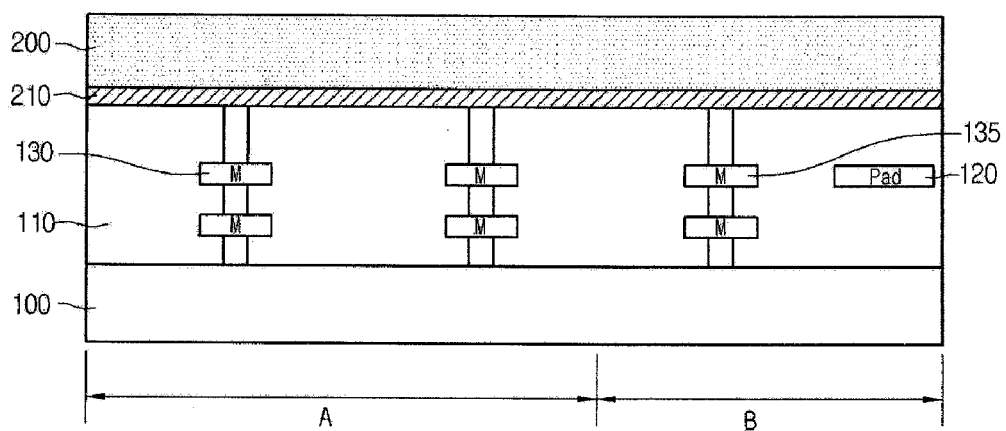

As illustrated in example FIG. 3, first substrate 100 and second substrate 20 including photodiode 200 may be coupled to each other. First substrate 100 and second substrate 20 may be coupled to each other by a bonding process, for example. Specifically, a surface of photodiode 200 formed on and/or over second substrate 20 may be positioned over amorphous silicon layer 210 of first substrate 100 and the surface of photodiode 200 may be bonded to amorphous silicon layer 210 of first substrate to thereby couple first substrate 100 and second substrate 20. The forming of amorphous silicon layer 210 may allow converting the underlying metal plug to a silicide plug.

When first substrate 100 and second substrate 20 are coupled to each other, amorphous silicon layer 210 may be electrically connected to photodiode 20. As illustrated in example FIG. 4, second substrate 20 may be removed with photodiode 200 left over first substrate 100. As second substrate 20 is removed, photodiode 200 may remain over first substrate 100. Because amorphous silicon layer 210 and photodiode 200 are left over first substrate 100, first substrate 100 and photodiode 200 achieve a vertical integration. Because a hydrogen ion layer may be formed between second substrate 20 and photodiode 200, second substrate 20 and photodiode 200 may be separated by the hydrogen ion layer.

Figure 5:
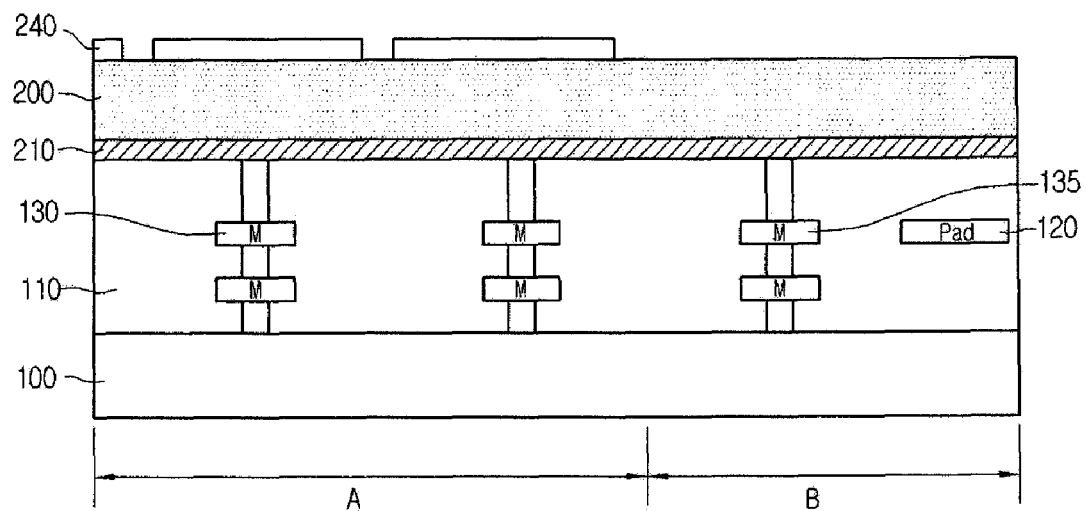

As illustrated in example FIG. 5, device isolation pattern 240 may be formed on and/or over photodiode 200. The forming of device isolation pattern 240 may include forming a dielectric such as an oxide layer on and/or over photodiode 200, and then patterning the dielectric such that the dielectric may be separated for each unit pixel, to form device isolation pattern 240 selectively exposing photodiode 200. Also, device isolation pattern 240 may expose photodiode 200 on the peripheral region (B).

Figure 6:
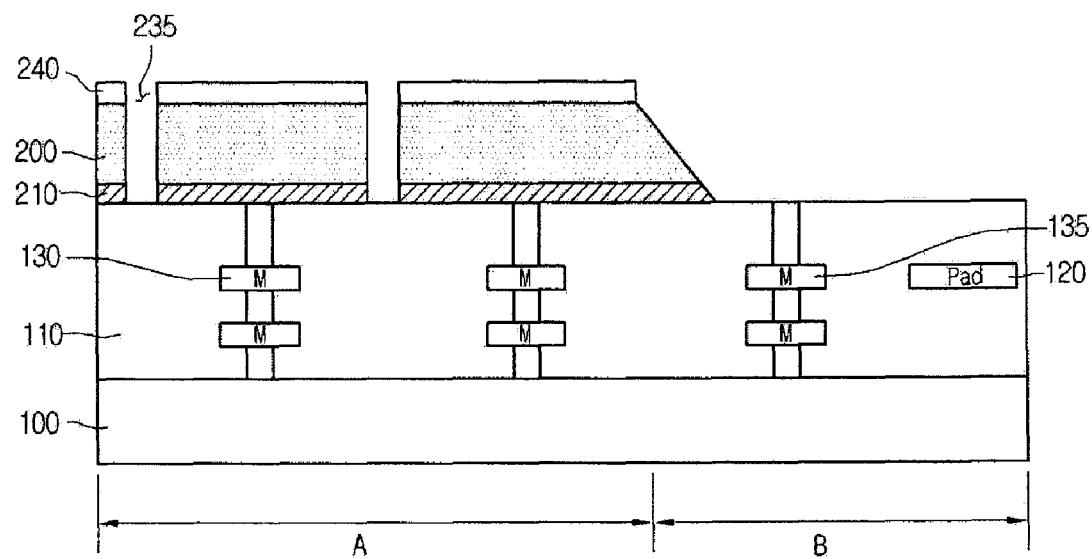

As illustrated in example FIG. 6, device isolation trench 235 may be formed in photodiode 200. Device isolation trench 235 may, for example, be formed by etching photodiode 200 using device isolation pattern 240 as an etch mask. Therefore, photodiode 200 on the pixel region (A) may be separated by device isolation trench 235 and may be connected to lower metal interconnection separated for each unit pixel. Also, photodiode 200 of the peripheral region (B) may be removed so that interlayer dielectric 110 and the plug connected to lower metal interconnection 135 of the peripheral region (B) may be exposed.

Figure 7:
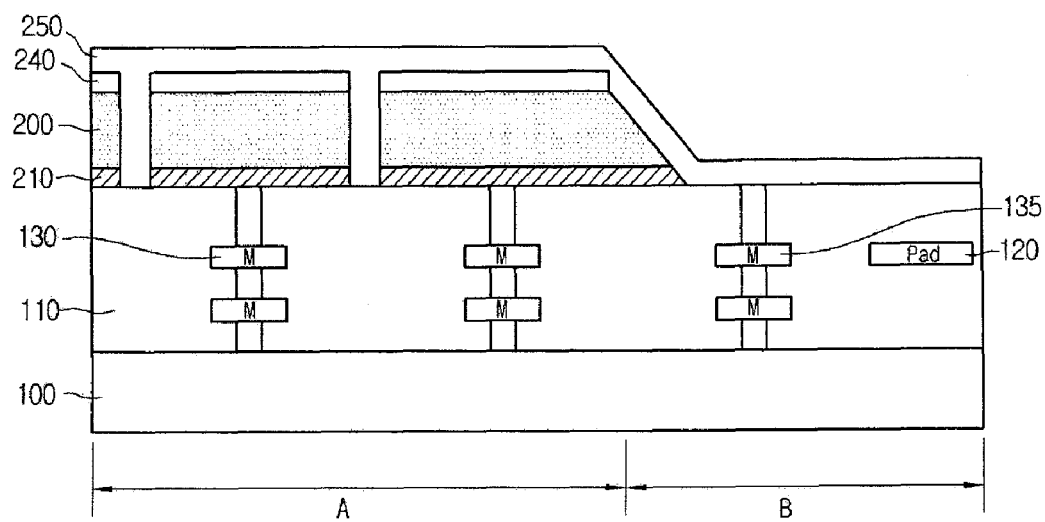

As illustrated in example FIG. 7, device isolation layer 250 may be formed on and/or over first substrate 100 including device isolation trench 235. Device isolation layer 250 may be formed by depositing a dielectric such as an oxide layer on and/or over first substrate 100. Also, device isolation layer 250 may be formed on and/or over first substrate 100 while filling device isolation trench 235, so that photodiode 200 may be separated for each unit pixel. Because device isolation layer 250 may be formed on substantially the entire upper surface of first substrate 100, i.e., on the upper surface of the crystalline semiconductor layer and on interlayer dielectric 110 of the peripheral region (B), device isolation layer 250 can protect the image sensor.

Figure 8:
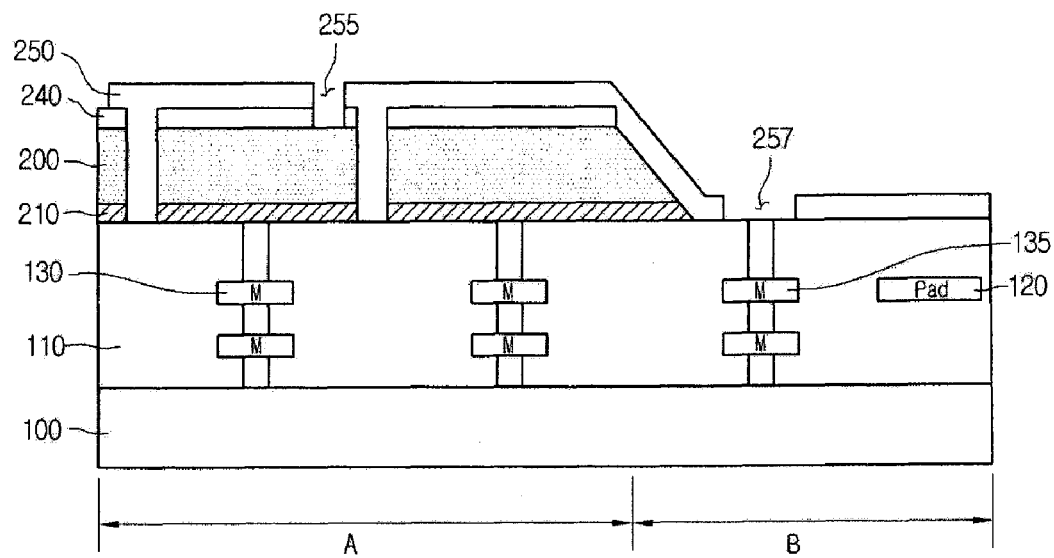

As illustrated in example FIG. 8, first and second via holes 255 and 257 may be formed in device isolation layer 250. That is, first via hole 255 at least partially exposing a surface of photodiode 200 and second via hole 257 at least partially exposing the plug connected to lower metal interconnection 135 of the peripheral region (B) may be formed.

Figure 9:
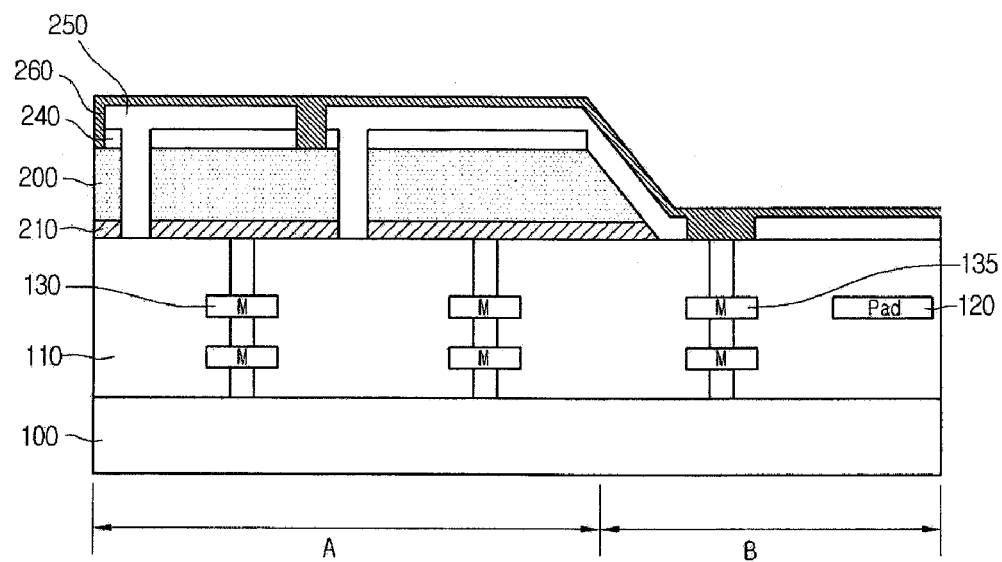

As illustrated in example FIG. 9, upper electrode layer 260 may be formed on and/or over device isolation layer 250 including first and second via holes 255 and 257. Upper electrode layer 260 may be formed, for example, by depositing a conductive material layer on and/or over device isolation layer 250 including first and second via holes 255 and 257. For example, upper electrode layer 260 may be formed of a conductive material such as, for example, Ti, Al, Cu, Co or W. Upper electrode layer 260 may be electrically connected to photodiode 200 through first via hole 255. Also, upper electrode layer 260 may be electrically connected to lower metal interconnection 135 of the peripheral region (B) through second via hole 257.

Figure 10:
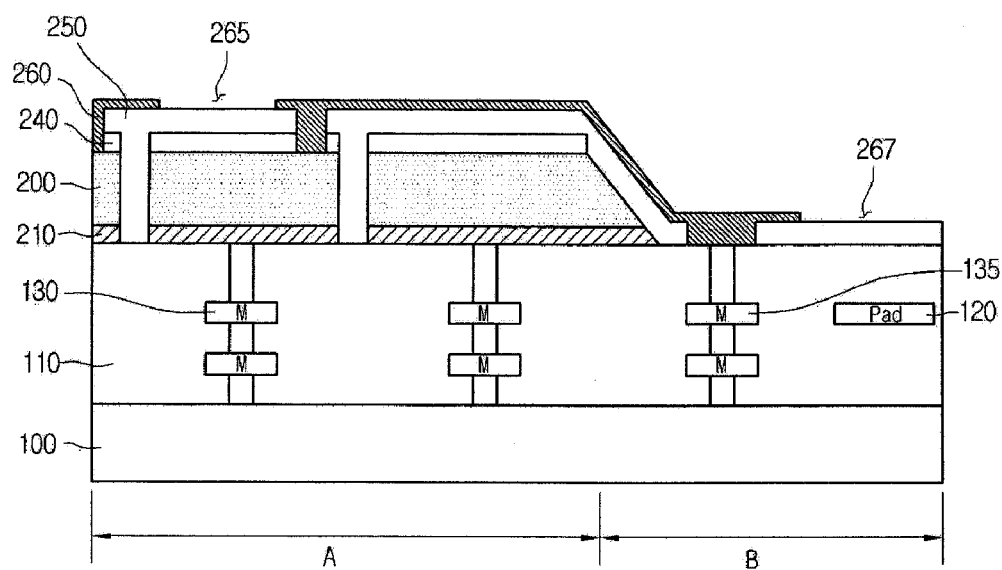

As illustrated in example FIG. 10, first opening 265 exposing a light receiving region of photodiode 200 formed for each unit pixel may be formed in upper electrode layer 260. The light receiving region of photodiode 200 may be formed by partially removing upper electrode layer 260 on and/or over photodiode 200 to form first opening 265. Second opening 267 exposing device isolation layer 240 over pad 120 may be formed together with first opening 265.

Figure 11:
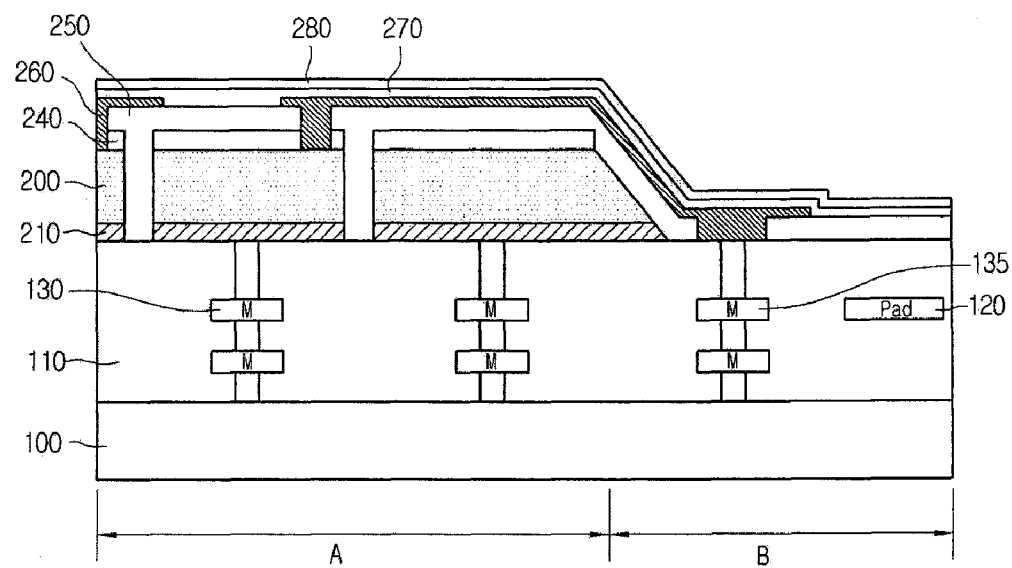

As illustrated in example FIG. 11, first and second passivation layers 270 and 280 may be formed on and/or over first substrate 100 including first and second openings 265 and 267. First passivation layer 270 may contact device isolation layer 250 through first opening 265. For example, first passivation layer 270 may be formed of an oxide layer or a nitride layer. Second passivation layer 280 may be formed on, or over, first substrate 100 including first passivation layer 270. For example, second passivation layer 280 may be formed of an oxide layer or a nitride layer.

Figure 12:
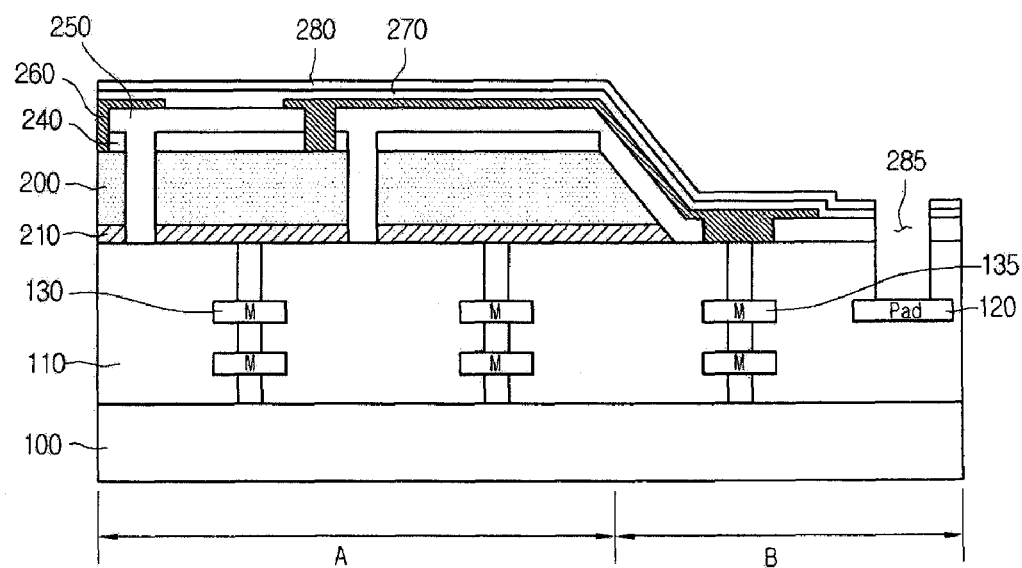

As illustrated in example FIG. 12, pad hole 285 exposing pad 120 of the peripheral region (B) may be formed. Pad hole 285 may be formed by removing interlayer dielectric 110, device isolation layer 250, first passivation layer 270 and second passivation layer 280 over pad 120. As illustrated in example FIG. 13, pad passivation layer 290 may be formed on and/or over first substrate 100 including pad hole 285. Pad passivation layer 290 assists in preventing pad 120 from being contaminated during subsequent processes such as, for example, forming a color filter or forming a microlens. Thus, a color filter and a microlens may be formed on and/or over pad passivation layer 290. The color filter, for example, may be formed in each pixel to filter colors from incident light, and may include red (R), green (G) and blue (B) color filters.

The method for manufacturing an image sensor in accordance with embodiments can maximize the bonding force between first substrate 100 and second substrate 20 by forming amorphous silicon layer 210 on and/or over first substrate 100 including interlayer dielectric 110. Also, the method for manufacturing an image sensor in accordance with embodiments can provide vertical integration of the image sensor by forming photodiode 200 on and/or over first substrate 100. Further, the method for manufacturing an image sensor in accordance with embodiments can minimize the generation of defects in the photodiode by forming photodiode 200 in the crystalline semiconductor layer.

Furthermore, the method for manufacturing an image sensor in accordance with embodiments can secure a light receiving region by at least partially connecting upper electrode layer 260 to photodiode 200. Moreover, the method for manufacturing an image sensor in accordance with embodiments can separate photodiode 200 for each unit pixel by forming device isolation layer 250 in the crystalline semiconductor layer.

It will be obvious and apparent to those skilled in the art that various modifications and variations can be made in the embodiments disclosed. Thus, it is intended that the disclosed embodiments cover the obvious and apparent the modifications and variations, provided that they are within the scope of the appended claims and their equivalents.

What is claimed is:

1. A method for manufacturing an image sensor comprising:
    forming an interlayer dielectric and a lower metal interconnection over a first substrate including a pixel region and a peripheral region;
    forming an amorphous silicon layer over the interlayer dielectric including the lower metal interconnection;
    forming a second substrate including a photodiode;
    bonding the second substrate including the photodiode on the amorphous silicon layer such that the amorphous silicon layer contacts the photodiode;
    removing the second substrate such that the photodiode is left on the amorphous silicon layer;
    forming an upper electrode layer, which is electrically coupled with the photodiode and the lower metal interconnection of the peripheral region; and
    forming a passivation layer over the upper electrode layer.

2. The method of claim 1, wherein the second substrate comprises a single crystalline substrate.

3. The method of claim 1, wherein the second substrate comprises a polycrystalline silicon substrate.

4. The method of claim 1, comprising:
    forming, prior to forming of the upper electrode layer, a device isolation layer such that the photodiode and the amorphous silicon layer are separated for each unit pixel.

5. The method of claim 4, wherein forming of the device isolation layer comprises:
    forming a device isolation trench in the photodiode and the amorphous silicon layer; and
    depositing a dielectric over the device isolation trench, the amorphous silicon layer and the photodiode.

6. The method of claim 4, wherein forming of the device isolation trench includes:
    removing the photodiode and the amorphous silicon layer on the peripheral region to expose the lower metal interconnection of the peripheral region.

7. The method of claim 1, wherein the upper electrode layer comprises a metal.

8. The method of claim 7, wherein the upper electrode layer comprises one of Titanium, Aluminum, Copper, Cobalt, and Tungsten.

9. The method of claim 1, wherein the amorphous silicon layer has a thickness between about 200 to about 1000 Å.

10. The method of claim 1, wherein the lower metal interconnection comprises one of a metal, an alloy, and a silicide.

11. The method of claim 1, wherein the lower metal interconnection comprises one of Aluminum, Copper, Cobalt, and Tungsten.

* * * * *